US009900013B2

(12) United States Patent
Hwang (10) Patent No.: US 9,900,013 B2
(45) Date of Patent: Feb. 20, 2018

(54) COUNTING APPARATUS AND IMAGE SENSOR INCLUDING THE SAME (71) Applicant: SK hynix Inc., Gyeonggi-do (KR)

(72) Inventor: Won-Seok Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 228 days.

(21) Appl. No.: 14/850,473

(22) Filed: Sep. 10, 2015

(65) Prior Publication Data
US 2016/0295150 A1  Oct. 6, 2016

(30) Foreign Application Priority Data

Apr. 6, 2015  (KR) .................. 10-2015-0048456

(51) Int. Cl.
*H03K 21/38*  (2006.01)
(52) U.S. Cl.
CPC ................... *H03K 21/38* (2013.01)
(58) Field of Classification Search
CPC .................................... H03M 1/123
See application file for complete search history.

(56) References Cited

U.S. PATENT DOCUMENTS 7,088,279 B2   8/2006  Muramatsu et al.
8,878,954 B2 * 11/2014  Hashimoto ............ H04N 5/225
                                                      341/155

FOREIGN PATENT DOCUMENTS

KR   1020040068935   8/2004
KR   1020080043141   5/2008

* cited by examiner

Primary Examiner — Tony Ko
(74) Attorney, Agent, or Firm — IP & T Group LLP (57) ABSTRACT A counting apparatus that includes a global counting unit suitable for performing a counting operation by controlling a counting bit number based on a count masking signal; a one-shot pulse generation unit suitable for generating a storage instruction signal based on the count masking signal; a latch unit suitable for storing a counting value outputted from the global counting unit based on the storage instruction signal; and a storage unit suitable for storing the counting value loaded from the latch unit.

23 Claims, 6 Drawing Sheets

COUNTING APPARATUS AND IMAGE SENSOR INCLUDING THE SAME

CROSS-REFERENCE TO RELATED APPLICATIONS

The present application claims priority of Korean Patent Application No. 10-2015-0048456, filed on Apr. 6, 2015, which is incorporated herein by reference in its entirety.

BACKGROUND

1. Field

Various embodiments of the present invention relate to an electronic apparatus, and more particularly, to a counting apparatus using a digital double sampling (DDS) scheme based on global counting, and an image sensor including the same.

2. Description of the Related Art

Electronic apparatuses use counters to convert measurements such as intensity of light, intensity of sound, and time into digital signals.

For example, an image sensor acquires an image by using semiconductor properties that respond to incident light, and includes analog-to-digital converters to convert an analog signal outputted from a pixel array into a digital signal. The analog-to-digital converters (ADC) have counters that perform counting operations based on a clock. That is, a single slope analog-to-digital converter (i.e., a single slope ADC) in an image sensor uses a counter to convert a signal into a digital code according to a pulse width of the signal.

Performance of systems that have counters is directly influenced by the operation speed and power consumption of the counters. This includes image sensors because they generally have multiple counters to convert analog signals outputted from a pixel array into digital signals. The number of counters increases as the resolution of image sensors increases. As the number of counters increases, the operation speed and power consumption of the counters becomes an even more important factor in determining overall performance.

In a global counting structure, a digital double sampling (DDS) scheme is used to cancel readout offset. Therefore, a line memory for counting readout offsets and a line memory for counting pixel signal's are used, resulting in an increase in memory capacity.

SUMMARY

Various embodiments are directed to a counting apparatus capable of reducing a counting bit number through count masking, and an image sensor including the same.

In an embodiment, a counting apparatus may include: a global counting unit suitable for performing a counting operation by controlling a counting bit number based on a count masking signal; a one-shot pulse generation unit suitable for generating a storage instruction signal based on the count masking signal; a latch unit suitable for storing a counting value outputted from the global counting unit based on the storage instruction signal; and a storage unit suitable for storing the counting value loaded from the latch unit.

The counting apparatus may further include: a correction unit suitable for correcting the counting value by using a reset digital offset value.

The correction unit may correct a reset counting value and a signal counting value from the storage unit by adding the reset counting value and the signal counting value to the reset digital offset value.

The global counting unit may reduce a counting number of a reset bit and a signal bit by using the count masking signal.

The storage instruction signal may be activated when a correlated double sampling output is changed from a logic high level to a logic low level.

The latch unit may include: a first latch suitable for storing a reset counting value and a signal counting value outputted from the global counting unit based on the storage instruction signal; and a second latch suitable for storing the signal counting value based on the storage instruction signal.

The storage unit may include: a first memory suitable for locally storing a reset counting value and a signal counting value loaded from the latch unit; and a second memory suitable for locally storing the signal counting value loaded from the latch unit.

The first memory may include: a reset memory suitable for storing the reset counting value; and a first signal memory suitable for storing the signal counting value.

The second memory may include: a second sign memory suitable for storing the signal counting value.

In another embodiment, an image sensor may include: control unit suitable for generating a count masking signal; comparator suitable for comparing a pixel signal with a ramp signal to generate a comparison signal; a global counting unit suitable for performing a counting operation by controlling a counting bit number based on the count masking signal; a one-shot pulse generation unit suitable for generating a storage instruction signal based on the count masking signal and the comparison signal; a latch unit suitable for storing a counting value outputted from the global counting unit based on the storage instruction signal; and a storage unit suitable for storing the counting value loaded from the latch unit.

The image sensor may further include: a correction unit suitable for correcting the counting value by using a reset digital offset value.

The correction unit may correct a reset counting value and a signal counting value from the storage unit by adding the reset counting value and the signal counting value to the reset digital offset value.

The global counting unit may reduce a counting number of a reset bit and a signal bit by using the count masking signal.

The storage instruction signal may be activated when a correlated double sampling output is changed from a logic high level to a logic low level.

The latch unit may include: a first latch suitable for storing a reset counting value and a signal counting value from the global counting unit based on the storage instruction signal; and a second latch suitable for storing the signal counting value based on the storage instruction signal.

The storage unit may include: a first memory suitable for locally storing a reset counting value and a signal counting value loaded from the latch unit; and a second memory suitable for locally storing the signal counting value loaded from the latch unit.

The first memory may include: a reset memory suitable for storing the reset counting value; and a first signal memory suitable for storing the signal counting value.

the second memory may include: a second signal memory suitable for storing the signal counting value.

The comparator may perform a correlated double sampling operation.

In an embodiment, a method for operating an image sensor may include: comparing a pixel signal with a ramp signal to generate a comparison signal; performing a counting operation by controlling a counting bit number based on a count masking signal; generating a storage instruction signal based on the count masking signal and the comparison signal; latching a counting value generated through the counting operation based on the storage instruction signal; and storing the counting value in a memory.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In this disclosure, when one part is referred to as being 'connected' to another part, t should be understood that the former can be 'directly connected' to the latter, or 'electrically connected' to the latter via an intervening part. Furthermore, when it is described that something comprises (or includes or has) elements, it should be understood that it may have (or include or has) only those elements, or it may have (or includes or have) other elements as well as those elements if there is no specific limitation. The terms of a singular form may include plural forms unless stated otherwise.

Figure 1:
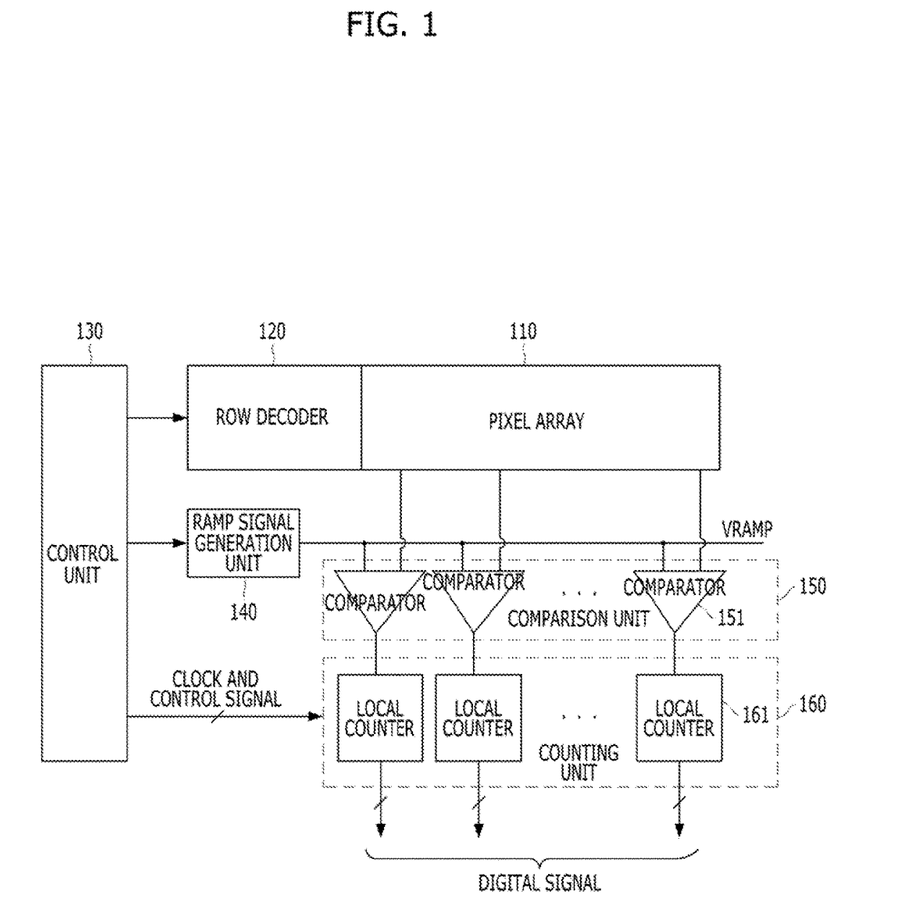
FIG. 1 is a diagram illustrating an image sensor.

FIG. 1 is a block diagram illustrating an image sensor.

Referring to FIG. 1, the image sensor includes a pixel array 110, a row decoder 120, a control unit 130, a ramp signal generation unit 140, a comparison unit 150, and a counting unit 160.

The pixel array 110 includes a plurality of pixels arranged to convert incident light into an electrical analog signal by a unit element (for example, a pixel) and output the electrical analog signal. The row decoder 120 is provided to control the operation of the pixel array in units of rows and/or columns. The control unit 130 generates a clock and a control signal for controlling operation timings of each element of the image sensor. The clock and the control signal generated in the control unit 130 may include an input clock, an initialization signal, and the like. The ramp signal generation unit 140 generates a ramp signal VRAMP under the control of the control unit 130 to output the ramp signal VRAMP to the comparison unit 150. The ramp signal VRAMP is used as a reference signal.

An analog pixel signal read from the pixel array 110 is compared with the ramp signal VRAMP and is counted by an analog-to-digital converter realized by the ramp signal generation unit 140 and the comparison unit 150, and then is converted into a digital signal. The pixel signal is outputted and processed in each column. To this end, the comparison unit 150 and the counting unit 160 may respectively include a plurality of comparators 151 and a plurality of local counters 161 corresponding to respective columns. Pixel signals of one row are simultaneously processed in a parallel manner by using the signal processing circuit provided in each column as described above, so that the image sensor may perform a high speed operation with improved band performance or noise.

Figure 2:
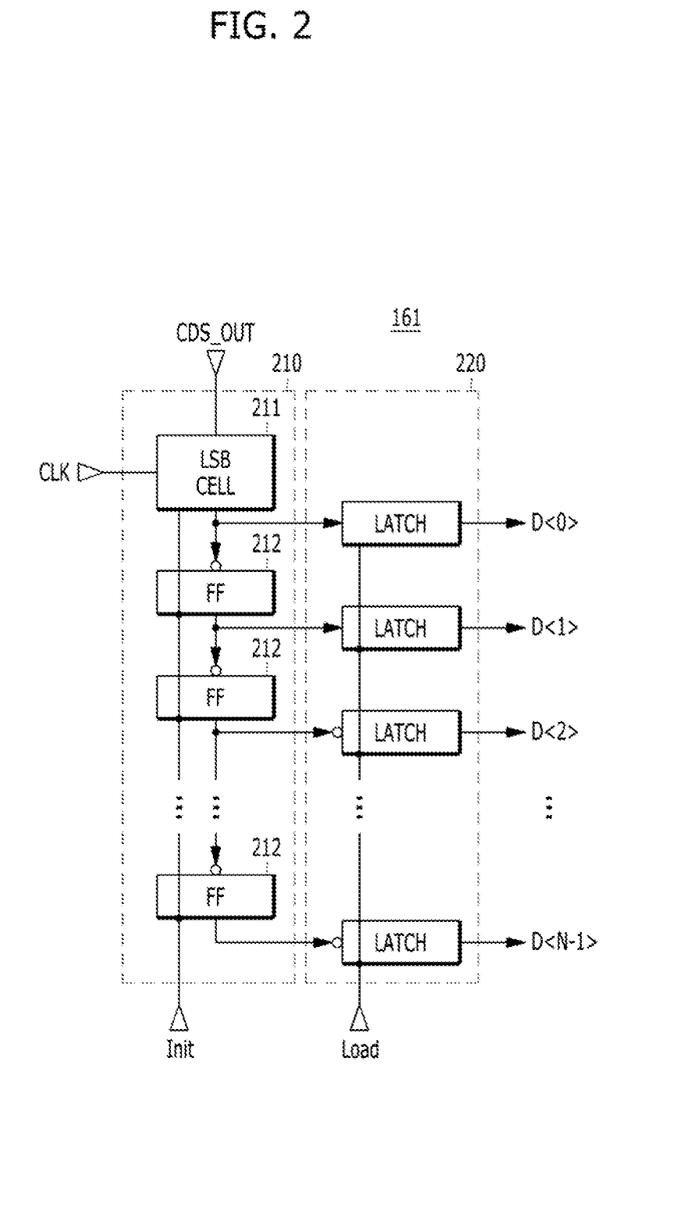
FIG. 2 is a detailed diagram of a local counter shown in FIG. 1.

FIG. 2 is a detailed diagram of the local counter 161 shown in FIG. 1.

As illustrated in FIG. 2, the local counter 161 includes a counter 210 and a memory 220. The counter 210 includes an LSB cell block 211 and n−1 flip-flops (FFs) 212 (where n is a natural number greater than or equal to 2). The LSB cell block 211 is initialized by the initialization signal Init generated from the control unit 130, receives an input clock CLK from the control unit 130, receives a correlated double sampling output CDS_OUT from the comparators 151, and determines the least significant bit (LSB), and the n−1 flip-flops 212 receive the output of the LSB cell block 211 or an output of the previous stage to output respective bit values. The memory 220 may be realized using n latches that receive a load signal LOAD generated from the control unit 130. The n latches output digital signal D<0:N−1>.

In a global counting structure, a DDS scheme is used to cancel readout offset. Therefore, a line memory for counting readout offset and a line memory for counting a pixel signal are separately used, thereby resulting in an increase in the memory capacity.

To resolve such concerns, in a DDS global counting apparatus in accordance with an embodiment of the present invention, a counting bit number is minimized by employing a DDS scheme based on global counting and count masking, so that the size and power consumption of the DDS global counting apparatus may be reduced.

Figure 3:
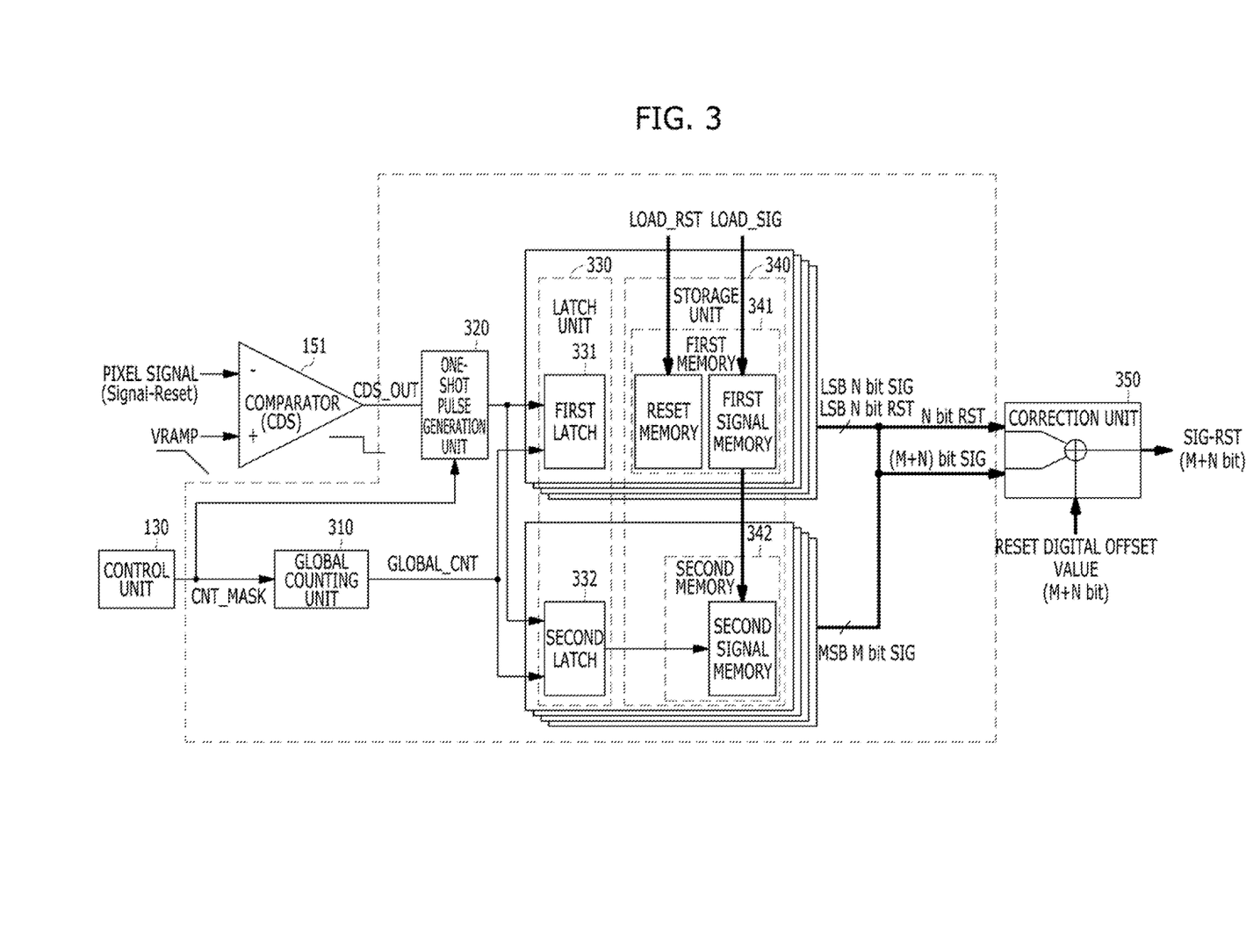
FIG. 3 is a diagram illustrating a DDS global counting apparatus using count masking in accordance with an embodiment of the present invention.

FIG. 3 is a block diagram illustrating a DDS global counting apparatus using count masking in accordance with an embodiment of the present invention.

As illustrated in FIG. 3, the DDS global counting apparatus may include a global counting unit 310, a one-shot pulse generation unit 320, a latch unit 330, and a storage unit 340. The global counting unit 310 operates in a global manner, and controls and counts a counting bit number according to a count masking signal CNT_MASK generated from an external control unit 130, and the one-shot pulse generation unit 320 generates a storage instruction signal according to the count masking signal CNT_MASK and a comparison signal, that is, a correlated double sampling output CDS_OUT generated from an external comparator 151. The latch unit 330 stores a counting value from the global counting unit 310 according to the storage instruction signal from the one-shot pulse generation unit 320, and the storage unit 340 stores the counting value loaded from the latch unit 330. Preferably, the other elements (i.e., the one-shot pulse generation unit, the latch unit, and the storage unit), except for the global counting unit 310, are provided in each column.

In this case, the DDS global counting apparatus further includes a correction unit 350 for correcting the counting value from the storage unit 340 by using a reset digital offset value (Rst_Digital_Offset).

The global counting unit 310 operates in a global manner, and reduces and counts a counting number of a reset bit and a signal bit by using the count masking signal CNT_MASK. The global counting unit 310 may be realized using a ripple counter.

The one-shot pulse generation unit 320 generates the storage instruction signal based on the count masking signal CNT_MASK and a correlated double sampling output CDS_OUT that is a pulse signal generated from the external comparator 151 and transfers the storage instruction signal to the latch unit 330. The storage instruction signal may be a one-shot pulse that is generated (i.e., activated) when correlated double sampling output CDS_OUT is deactivated (e.g., changed from a logic high level to a logic low level).

The latch unit 330 includes a first latch 331 for storing a reset counting value and a signal counting value from the global counting unit 310 according to the storage instruction signal (for example, the one-shot pulse) from the one-shot pulse generation unit 320, and a second latch 332 for storing the signal counting value from the global counting unit 310 according to the storage instruction signal from the one-shot pulse generation unit 320. The first latch 331 stores a lower N bit reset counting value (LSB N bit RST) and a lower N bit signal counting value (LSB N bit SIG), and the second latch 332 stores an upper M bit signal counting value (MSB M bit SIG).

The storage unit 340 includes a first memory 341 for storing the reset counting value and the signal counting value loaded from the first latch 331 of the latch unit 330, in a local manner, and a second memory 342 for storing the signal counting value loaded from the second latch 332 of the latch unit 330, in a local manner. The storage unit 340 loads the reset counting value from the first latch 331 according to a reset road (Rst Road) signal from an external timing generator (not illustrated) and loads the signal counting value from the first latch 331 and the second latch 332 according to a signal road (Sig Road) signal.

The first memory 341 includes a reset (RST) memory for storing the reset counting value loaded from the first latch 331, in response to a first load signal LOAD_RST, and a first signal (SIG) memory for storing the signal counting value loaded from the first latch 331, in response to a second load signal LOAD_SIG. The second memory 342 includes a second signal (SIG) memory for to storing the signal counting value loaded from the second latch 332, in response to a second load signal LOAD_SIG. The reset (RST) memory stores the lower N bit reset counting value (LSB N bit RST), the first signal (SIG) memory stores the lower N bit signal counting value (LSB N bit SIG), and the second signal (SIG) memory stores the upper M bit signal counting value (MSB M bit SIG).

The correction unit 350 corrects the reset counting value and the signal counting value from the storage unit 340 by adding the reset counting value and the signal counting value to a reset digital offset value decided in advance. That is, the correction unit 350 adds a M+N bit signal counting value (M+N bit SIG) and a N bit reset counting value (N bit RST) from the storage unit 340 to a fixed reset digital offset value (M+N bit). In this case, the correction unit 350 uses a two's complement scheme for a correction operation. The correction unit 350 may be provided to a rear stage of the analog part as illustrated in FIG. 3, or may be realized in the digital part.

The DDS scheme through a two's complement will be described in more detail below.

The DDS output indicates a "SIG-RST". In the embodiment of the present invention, a two's complement scheme is used for "-Rst", and a two's complement operation is performed only by reset bits with a limitedly assigned number (for example, four bits) as illustrated in the following example.

<Example> Assign Reset Counting Four Bits

Assign reset (RST) memory four bits
COUNTER OUT=SIG−RST=SIG+2's (RST)
RST one-shot=1110 (14)
SIG one-shot=1111110010 (1010)
2's (RST)=1111110001+1 (−14)
+SIG=1111110010
1 1111100100 (996)

Herein, a code bit is discarded from a final result value. This is because the reset counting value is always smaller than the signal counting value.

The final output may be expressed by Equation 1 below.

$$\text{Final output}=\text{SIG}+\text{Bar(RST)}+\text{Rst\_digital\_offset} \quad (1111110001) \qquad \text{<Equation 1>}$$

Referring to Equation 1, the final output (M+N bit) may be obtained through the signal counting value, the reset counting inversion value, and the reset digital offset value.

As described above, in accordance with an embodiment of the present invention, reset counting is added for the DDS output and the reset counting inverted value and the fixed reset digital offset value are added to each other, so that it is possible to realize a DDS function in the global counting without adding a bit wise inversion to scheme and the like. In this way, a bit number assigned to the existing reset bit and signal bit may be reduced.

Figure 4:
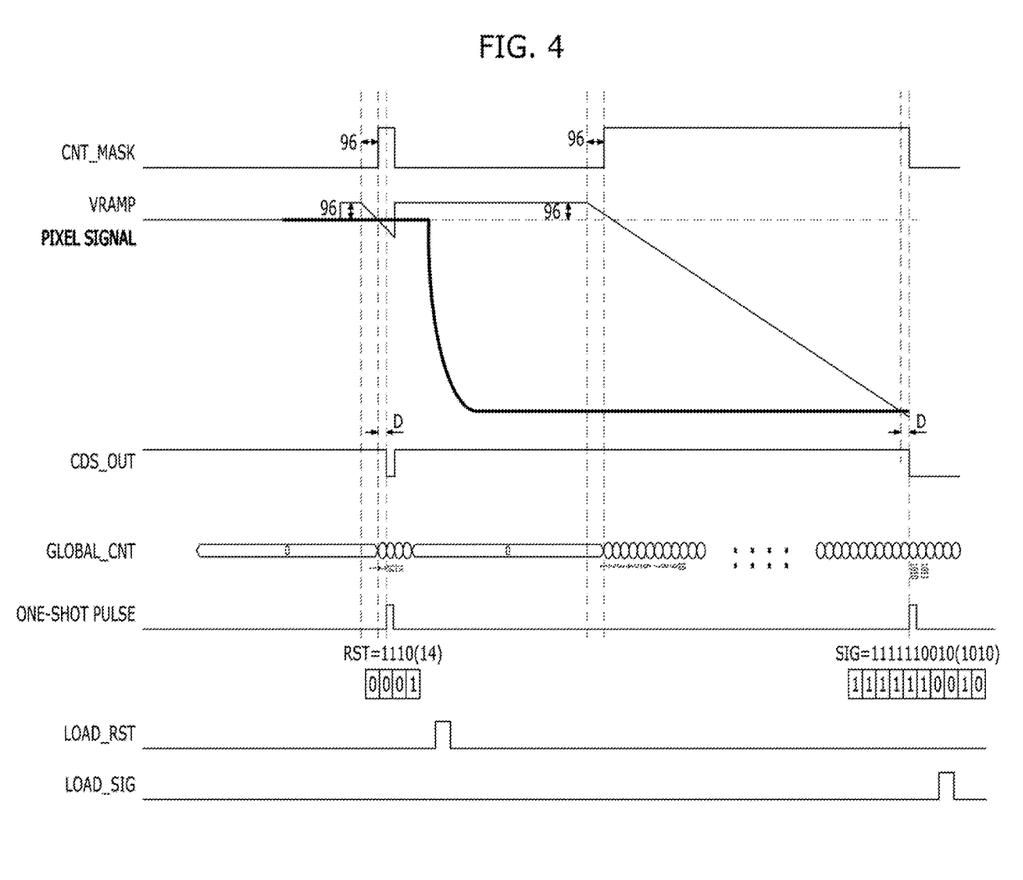
FIG. 4 is a timing diagram for describing an operation of the DDS global counting apparatus shown in FIG. 3.

FIG. 4 is a timing diagram for describing an operation of the DDS global counting apparatus shown in FIG. 3.

In the global counting structure, for realizing the DDS scheme, offset counting of a readout circuit (i.e., reset counting) is used and a reset bit is assigned. A counting number of the reset bit and the signal bit is limited to an already decided bit number for reduction by using the count masking signal CNT_MASK.

Furthermore, the global counting unit is initialized before a pixel signal is counted according to the ramp signal VRAMP, and the reset counting value and the signal counting value are respectively stored in the latches by the one-shot pulse that is generated when the correlated double sampling output CDS_OUT is deactivated (e.g., changed from a logic high level to a logic low level) and are assigned to the line memories according to the loading signal LOAD_SIG.

For reference, the reference numeral 'D' shown in FIG. 4 denotes an inherent delay amount which has been reflected on the correlated double sampling output CDS_OUT.

Figure 5A:
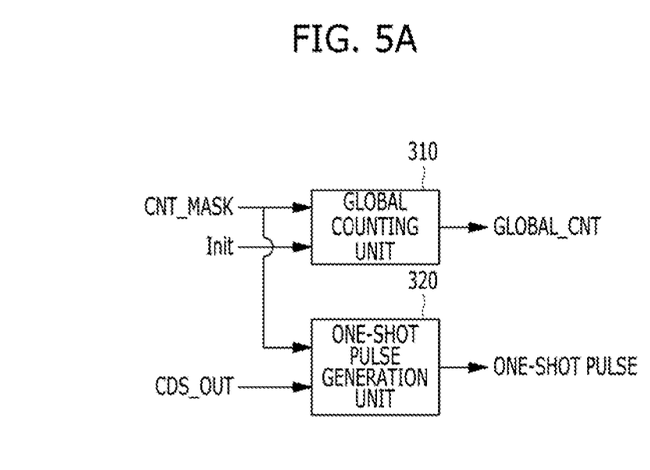
FIGS. 5A to 5C are diagrams for describing a count masking scheme in accordance with one embodiment of the present invention.
Figure 5B:
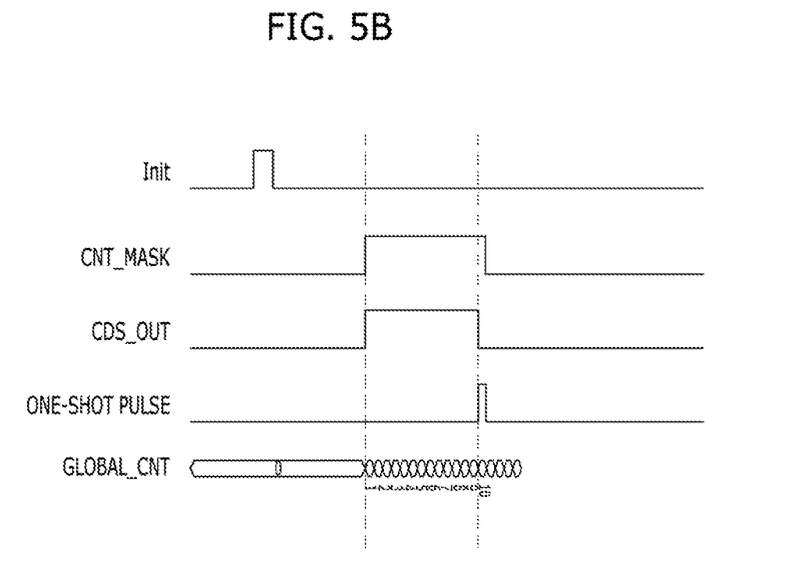
Figure 5C:
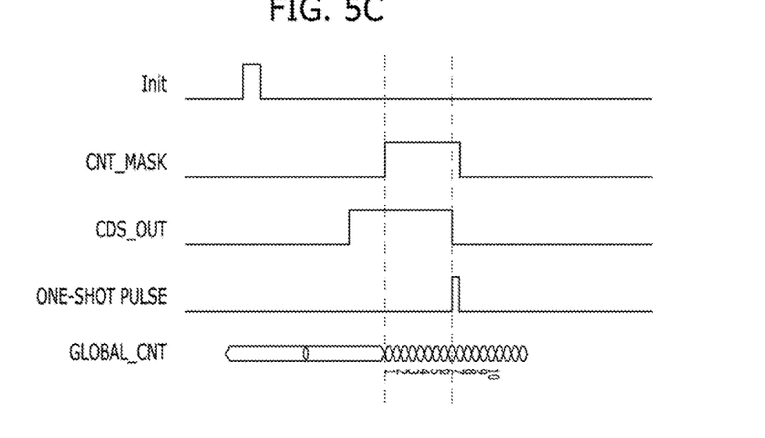

FIGS. 5A to 5C are diagrams for describing a count masking scheme.

As illustrated in FIG. 5A, the global counting unit 310 is initialized by the initialization signal Init before the pixel signal is counted according to the ramp signal VRAMP, and reduces and counts to the counting number of the reset bit and the signal bit by using the count masking signal CNT_MASK. For reference, the initialization signal Init may be generated by the external control unit 130.

The one-shot pulse generation unit 320 generates the one-shot pulse according to the count masking signal CNT_MASK and the correlated double sampling output CDS_OUT. As illustrated in FIGS. 5B and 5C, the one-shot pulse is generated when the correlated double sampling output CDS_OUT is converted from high to low.

As illustrated in FIG. 5B, when a high period of the count masking signal CNT_MASK has a range including an entire high period of the correlated double sampling output CDS_OUT, it is not possible to reduce the counting number of the reset bit counted in the global counting unit 310, As illustrated in FIG. 5C, when the logic high period of the count masking signal CNT_MASK has a range including a part of the logic high period of the correlated double sampling output CDS_OUT, the counting number of the reset bit counted in the global counting unit 310 may be reduced.

By the aforementioned method, it is possible to reduce a bit number assigned to the existing reset bit and signal bit. That is, the counting number of the reset bit and the signal bit is controlled through the count masking signal CNT_MASK.

Figure 6:
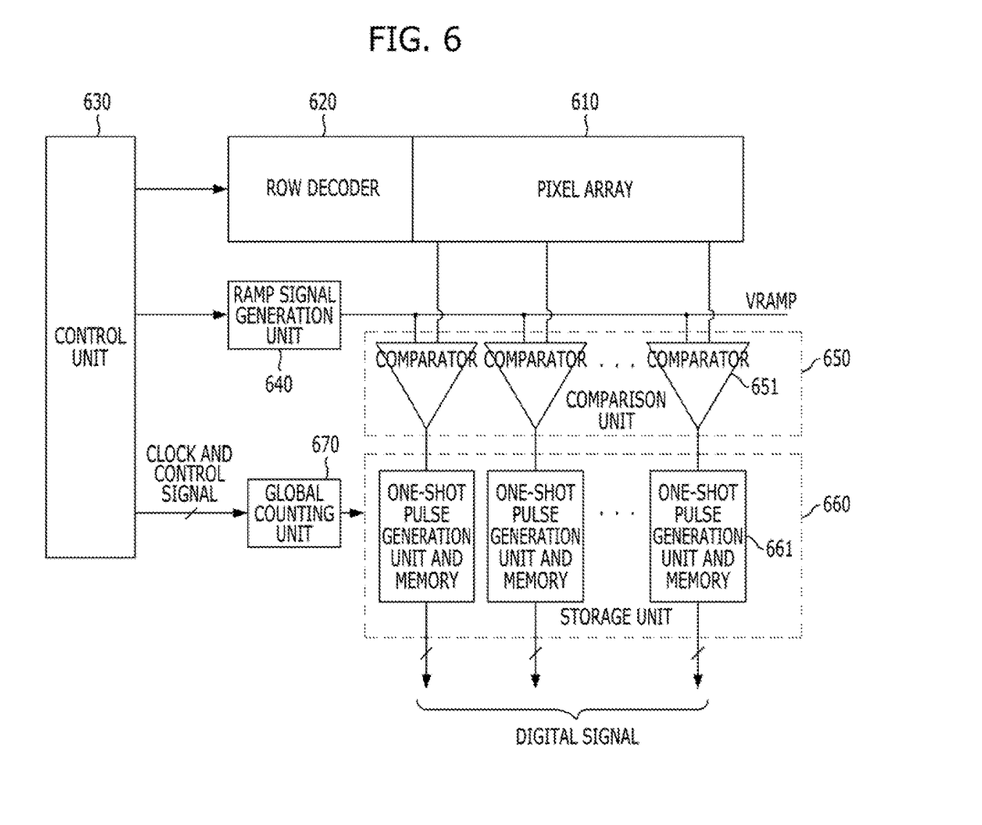
FIG. 6 is a block diagram illustrating an image sensor in accordance with an embodiment of the present invention.

FIG. 6 is a block diagram illustrating an image sensor in accordance with an embodiment of the present invention.

Referring to FIG. 6, the image sensor may include a pixel to array 610, a row decoder 620, a control unit 630, a ramp signal generation unit 640, a comparison unit 650, a storage unit 660, and a global counting unit 670.

The pixel array 610 includes a plurality of pixels arranged to convert incident light into an electrical analog signals (i.e., a pixel signals) by unit elements (for example, pixels) and output the electrical analog signals. The row decoder 620 is provided to control the operation of the pixel array. The control unit 630 generates a clock and a control signal for controlling operation timings of each element of the image sensor. The clock and the control signal generated in the control unit 630 may include an input clock, an initialization signal, a count masking signal, and the like. The ramp signal generation unit 640 generates a ramp signal VRAMP under the control of the control unit 630 to output the ramp signal VRAMP to the comparison unit 650. The ramp signal VRAMP is used as a reference signal for the comparison unit 650.

An analog pixel signal read from the pixel array 610 is compared with the ramp signal VRAMP and is counted by the comparison unit 650, the storage unit 660, and the global counting unit 670. The pixel signal is outputted and processed in each column. To this end, the comparison unit 650 and the storage unit 660 may respectively include a plurality of comparators 651 and a plurality of one-shot pulse generation units and memories 661 corresponding to respective columns.

In this case, the global counting unit 670 and the one-shot pulse generation units and memories 661 may be realized similarly to the aforementioned DDS global counting apparatus shown in FIG. 3.

As described above, in accordance with an embodiment of the present invention, the counting number of the signal bit and the reset bit is reduced using the count masking signal. Consequently, the counting bit number is controlled, so that the size and power consumption of the DDS global counting apparatus may be reduced.

Although various embodiments have been described for illustrative purposes, it will be apparent to those skilled in the art that various changes and modifications may be made without departing from the spirit and scope of the invention as defined in the following claims.

What is claimed is:

1. A counting apparatus comprising:
    a global counting unit suitable for receiving a count masking signal and performing a counting operation by controlling a counting bit number based on the count masking signal;
    a one-shot pulse generation unit suitable for receiving a comparison signal generated from a comparator and generating a storage instruction signal based on the count masking signal and the comparison signal;
    a latch unit suitable for storing a counting value outputted from the global counting unit based on the storage instruction signal received from the one-shot pulse generation unit; and
    a storage unit suitable for storing the counting value loaded from the latch unit.

2. The counting apparatus of claim 1, further comprising:
    a correction unit suitable for correcting the counting value by using a reset digital offset value.

3. The counting apparatus of claim 2, wherein the correction unit corrects a reset counting value and a signal counting value from the storage unit by adding the reset counting value and the signal counting value to the reset digital offset value.

4. The counting apparatus of claim 1, wherein the global counting unit reduces a counting number of a reset bit and a signal bit by using the count masking signal.

5. The counting apparatus of claim 1, wherein the storage instruction signal is activated when a correlated double sampling output is changed from a logic high level to a logic low level.

6. The counting apparatus of claim 1, wherein the latch unit comprises:
    a first latch suitable for storing a reset counting value and a signal counting value outputted from the global counting unit based on the storage instruction signal; and
    a second latch suitable for storing the signal counting value based on the storage instruction signal.

7. The counting apparatus of claim 1, wherein the storage unit comprises:
    a first memory suitable for locally storing a reset counting value and a signal counting value loaded from the latch unit; and
    a second memory suitable for locally storing the signal counting value loaded from the latch unit.

8. The counting apparatus of claim 7, wherein the first memory comprises:
    a reset memory suitable for storing the reset counting value; and
    a first signal memory suitable for storing the signal counting value.

9. The counting apparatus of claim 8, wherein the second memory comprises:
    a second signal memory suitable for storing the signal counting value.

10. The counting apparatus of claim 1, wherein, when a logic high period of the count masking signal has a range including a part of a logic high period of the comparison signal, the counting bit number of the global counting unit is reduced.

11. An image sensor comprising:
    a control unit suitable for generating a count masking signal;
    a comparator suitable for comparing a pixel signal with a ramp signal to generate a comparison signal;

a global counting unit suitable for receiving the count masking signal from the control unit, and performing a counting operation by controlling a counting bit number based on the count masking signal;

a one-shot pulse generation unit suitable for receiving the comparison signal generated from the comparator and the count masking signal generated from the control unit, and generating a storage instruction signal based on the count masking signal and the comparison signal;

a latch unit suitable for storing a counting value outputted from the global counting unit based on the storage instruction signal received from the one-shot pulse generation unit; and a storage unit suitable for storing the counting value loaded from the latch unit.

12. The image sensor of claim 11, further comprising:
a correction unit suitable for correcting the counting value by using a reset digital offset value.

13. The image sensor of claim 12, wherein the correction unit corrects a reset counting value and a signal counting value from the storage unit by adding the reset counting value and the signal counting value to the reset digital offset value.

14. The image sensor of claim 11, wherein the global counting unit reduces a counting number of a reset bit and a signal bit by using the count masking signal.

15. The image sensor of claim 11, wherein the storage instruction signal is activated when a correlated double sampling output is changed from a logic high level to a logic low level.

16. The image sensor of claim 11, wherein the latch unit comprises:
a first latch suitable for storing a reset counting value and a signal counting value from the global counting unit based on the storage instruction signal; and
a second latch suitable for storing the signal counting value based on the storage instruction signal.

17. The image sensor of claim 11, wherein the storage unit comprises:

a first memory suitable for locally storing a reset counting value and a signal counting value loaded from the latch unit; and
a second memory suitable for locally storing the signal counting value loaded from the latch unit.

18. The image sensor of claim 17, wherein the first memory comprises:
a reset memory suitable for storing the reset counting value; and
a first signal memory suitable for storing the signal counting value.

19. The image sensor of claim 18, wherein the second memory comprises:
a second signal memory suitable for storing the signal counting value.

20. The image sensor of claim 11, wherein the comparator performs a correlated double sampling operation.

21. The image sensor of claim 11, wherein, when a logic high period of the count masking signal has a range including a part of a logic high period of the comparison signal, the counting bit number of the global counting unit is reduced.

22. A method for operating an image sensor, the method comprising:
comparing a pixel signal with a ramp signal to generate a comparison signal;
performing a counting operation by controlling a counting bit number based on a count masking signal and the comparison signal;
generating a storage instruction signal based on the count masking signal and the comparison signal;
latching a counting value generated through the counting operation based on the storage instruction signal; and
storing the counting value in a memory.

23. The method of claim 22, wherein, when a logic high period of the count masking signal has a range including a part of a logic high period of the comparison signal, the counting bit number is reduced.

* * * * *